(12) United States Patent
Chang et al.

(10) Patent No.: US 12,091,312 B2
(45) Date of Patent: Sep. 17, 2024

(54) SENSOR AND PACKAGE ASSEMBLY THEREOF

(71) Applicant: Robert Bosch GmbH, Stuttgart (DE)

(72) Inventors: Ken Chang, Taipei (TW); Wallace Chuang, Taipei (TW)

(73) Assignee: Robert Bosch GmbH, Stuttgart (DE)

( * ) Notice: Subject to any disclaimer, the term of this patent is extended or adjusted under 35 U.S.C. 154(b) by 452 days.

(21) Appl. No.: 17/294,616

(22) PCT Filed: Nov. 5, 2019

(86) PCT No.: PCT/EP2019/080169
§ 371 (c)(1),
(2) Date: May 17, 2021

(87) PCT Pub. No.: WO2020/108925
PCT Pub. Date: Jun. 4, 2020

(65) Prior Publication Data
US 2022/0009766 A1 Jan. 13, 2022

(30) Foreign Application Priority Data
Nov. 26, 2018 (CN) .......................... 201821962250.3

(51) Int. Cl.
*B81B 7/00* (2006.01)

(52) U.S. Cl.
CPC ...... *B81B 7/007* (2013.01); *B81B 2201/0264* (2013.01); *B81B 2207/012* (2013.01); *B81B 2207/098* (2013.01)

(58) Field of Classification Search
CPC .................. B81B 7/0061; B81B 7/007; B81B 2201/0264; B81B 2207/012; B81B 2207/096; B81B 2207/098; B81C 1/0023
(Continued)

(56) References Cited

U.S. PATENT DOCUMENTS

| 2016/0071818 A1* | 3/2016 | Wang | ...................... H01L 24/49 257/773 |
| 2017/0369307 A1* | 12/2017 | Karpman | ................ H01L 24/20 |

FOREIGN PATENT DOCUMENTS

TW     201620815 A     6/2016

OTHER PUBLICATIONS

International Search Report corresponding to PCT Application No. PCT/EP2019/080169, mailed Jan. 27, 2020 (4 pages).

* cited by examiner

*Primary Examiner* — Hrayr A Sayadian
(74) *Attorney, Agent, or Firm* — Maginot, Moore & Beck LLP

(57) ABSTRACT

The present utility model discloses a package assembly of a sensor, comprising: a redistribution layer having a first face and a second face that are opposite to each other, and a first via that penetrates the first face and the second face; a first die electrically connected to the first face of the redistribution layer; a sensing element electrically connected to the first face of the redistribution layer; a cover body located between the redistribution layer and the sensing element, wherein the cover body has a second via that penetrates the cover body, and the second via communicates with the first via; and a moulding compound comprising a third face and a fourth face that are opposite to each other, wherein the moulding compound encapsulates the first die and the sensing element on the side of the first face of the redistribution layer, and the third face of the moulding compound is combined with the first face of the redistribution layer. The package assembly of the sensor allows more components to be packaged together, provides a better structural support and heat distribution, and reduces the volume and costs of the package assembly.

13 Claims, 1 Drawing Sheet

(58) Field of Classification Search
USPC .......................................................... 257/415
See application file for complete search history.

SENSOR AND PACKAGE ASSEMBLY THEREOF

This application is a 35 U.S.C. § 371 National Stage Application of PCT/EP2019/080169, filed on Nov. 5, 2019, which claims the benefit of priority to Serial No. CN 201821962250.3, filed on Nov. 26, 2018 in China, the disclosures of which are incorporated herein by reference in their entirety.

The present disclosure relates to sensor technologies, and in particular to a sensor based on micro electro-mechanical technology, and a package assembly thereof.

BACKGROUND

A micro electro-mechanical system (MEMS) sensor is a sensor manufactured by using microelectronic and micromechanical processing techniques. Compared with conventional sensors, the MEMS sensor is characterized by a small volume, a light weight, low costs, low power consumption and high reliability, and is suitable for mass production and easy to integrate and achieve intelligentization. In addition, the feature size of the order of microns makes it possible for the MEMS sensor to complete certain functions that cannot be implemented by conventional mechanical sensors. MEMS sensors are widely applied to the fields of automobiles, portable consumer electronic devices, and even medical treatment.

A package of the MEMS sensor is a key factor in design and manufacture of the MEMS sensor, and the package of the MEMS sensor has special requirements, for example, the sensor needs to sense the change in an external environment and implement a function of leading out an electrical signal. Therefore, a path directly connected to the outside is required to be reserved on a housing of the sensor for sensing physical information such as light, heat, atmospheric pressure, and forces. A typical instance is that: for an MEMS pressure sensor, an opening is required to be arranged on a housing thereof for sensing external medium pressure. The conventional MEMS package comprises: chip package, element package, and system in package. However, for current market demands, more elements and functions are required to be integrated into an increasingly small space. It is difficult for existing package solutions to meet requirements for a device with a higher component density.

SUMMARY

An objective of the present disclosure is to solve the problem that a sensor is bulky. A package assembly of a sensor according to an embodiment of the present utility model disclosure includes:

a redistribution layer having a first face and a second face that are opposite to each other, and a first via that penetrates the first face and the second face;

a first die electrically connected to the first face of the redistribution layer;

a sensing element electrically connected to the first face of the redistribution layer;

a cover body located between the redistribution layer and the sensing element, wherein the cover body has a second via that penetrates the cover body, and the second via communicates with the first via; and a moulding compound comprising a third face and a fourth face that are opposite to each other, wherein the moulding compound encapsulates the first die and the sensing element on the side of the first face of the redistribution layer, and the third face of the moulding compound is combined with the first face of the redistribution layer.

Optionally, the package assembly of the sensor further has a second die, and the second die is electrically connected to the first face of the redistribution layer; and the moulding compound encapsulates the second die on the side of the first face of the redistribution layer.

Optionally, the package assembly further comprises a through mould via electrical connector, and the through mould via electrical connector penetrates the third face and the fourth face of the moulding compound and is connected to the redistribution layer; and the fourth face of the moulding compound further comprises a pad, and the redistribution layer is electrically connected to the pad by means of the through mould via electrical connector.

Optionally, the moulding compound further comprises a side wall connected to the third face and the fourth face, and the pad extends to an outer surface of the side wall of the moulding compound along the fourth face of the moulding compound.

Optionally, the cover body is connected to the sensing element, a first space is formed between the cover body and the sensing element, and the first space communicates with external space through the second via and the first via.

Optionally, the cover body is a silicon cover, and the sensing element is electrically connected to the first face of the redistribution layer by means of a through silicon via technique implemented on the cover body.

Optionally, the package assembly further comprises a conductive bump that is arranged on a part of a conductive column on the fourth face of the moulding compound.

Optionally, the sensing element has a front surface that is far away from the first face of the redistribution layer, and the front surface is flush with the fourth face of the moulding compound; and the sensing element is at least partially exposed outside the moulding compound.

Optionally, the sensing element is an MEMS pressure sensing element; and the first die is an ASIC.

According to another aspect of the present disclosure, a micro electro-mechanical system sensor is further disclosed, the micro electro-mechanical system sensor comprises a package assembly of the sensor and a carrier substrate, and the package assembly of the sensor is mounted onto the carrier substrate.

It can be learned from the above that, for the package assembly of the sensor in the present disclosure, by arranging a redistribution layer and a moulding compound, more elements are allowed to be packaged together, and a better structural support is provided or/and a better heat distribution is provided for the package assembly. In addition, the volume and costs of the entire package assembly are reduced.

BRIEF DESCRIPTION OF THE DRAWINGS

The features, characteristics, advantages, and benefits of the present disclosure will become apparent through the detailed description below in conjunction with the accompanying drawings.

DETAILED DESCRIPTION

Embodiments of the present disclosure are described in detail below in conjunction with the accompanying drawings.

Figure 1:
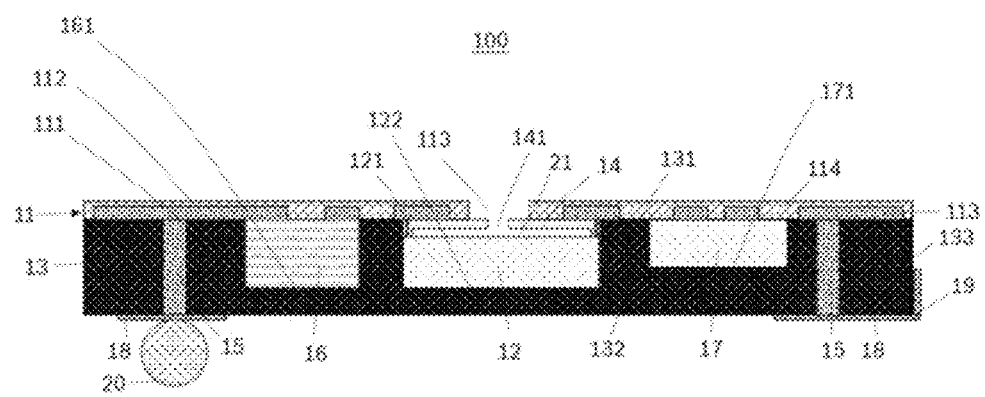
FIG. 1 shows a schematic cross-sectional structural diagram of a package assembly of a sensor according to one embodiment of the present disclosure.

FIG. 1 shows a cross-sectional structure of a package assembly 100 of a sensor according to one embodiment of the present disclosure. As shown in the figure, the package assembly 100 of the sensor comprises a redistribution layer (RDL) 11, a sensing element 12, a moulding compound 13, a cover body 14, and a first die 16. Optionally, the package assembly of the sensor further comprises a second die 17. The RDL 11 comprises a first face 111 and a second face 112 opposite to each other, and a first via 113 that penetrates the first face 111 and the second face 112. The sensing element 12, the first die 16, and the second die 17 are electrically connected to the first face 111 of the RDL 11. The moulding compound 13 encapsulates the sensing element 12, the first die 16, and the second die 17 on the side of the first face 111 of the RDL 11. The moulding compound 13 comprises a third face 131 and a fourth face 132 opposite to each other. When the moulding compound 13 encapsulates the sensing element 12, the first die 16, and the second die 17 on the side of the first face 111 of the RDL 11, the third face 131 of the moulding compound 13 is combined with the first face 111 of the RDL 11. In addition, the moulding compound 13 can further comprise several conductive columns 15, and the several conductive columns 15 extend from the first face 111 towards the second face 112 of the RDL 11 and penetrate the moulding compound 13. The cover body 14 is located between the redistribution layer 11 and the sensing element 12, the cover body 14 is partially connected to the sensing element 12, and a first space 21 is formed between the sensing element 12 and the cover body 14. The cover body 14 has a second via 141 that penetrates the cover body 14, and the second via 141 communicates with the first via 113. The second via 141 and the first via 113 communicate with the first space 21 and an external medium outside the sensor.

In this embodiment, the RDL 11 has a thickness thinner than that of a conventional organic or laminated substrate, and the thickness of the RDL 11 can be determined based on the number of re-configuration lines 113 and medium layers 114, and a formation manner. For example, a conventional six-layer organic or laminated substrate has a thickness of 300 μm to 500 μm. In this embodiment, the re-configuration line 113 has a thickness of 3 μm to 10 μm, and the medium layer 114 has a thickness of 2 μm to 5 μm. The RDL 11 in this embodiment is further allowed to achieve a narrower line spacing width (fine spacing) and a finer line than that of the conventional organic or laminated substrate. In this embodiment, the RDL 11 has a total thickness of less than 50 μm, for example, 30 μm to 25 μm, or less, for example, 20 μm. The RDL 11 comprises a re-configuration line 113 and a medium layer 114, and there may be one or more re-configuration lines 113. In this embodiment, the RDL 11 comprises an embedded re-configuration line 113. The re-configuration line may be formed, for example, in the following manner: the re-configuration line 113 is generated by first forming a seed crystal layer and then forming a metal (such as copper) pattern. Optionally, the re-configuration line 113 may also be formed by a deposition (such as sputtering and plating) and etching process. The material of the re-configuration line 113 may include, but is not limited to a metal material such as copper, titanium, nickel, gold, and a combination thereof, or an alloy thereof. The metal pattern of the re-configuration line 113 is then embedded into the medium layer 114. The medium layer 114 can be any appropriate medium material such as an oxide or a polymer (such as polyimide). An exposed portion of the re-configuration line 113 can be used for electrical connections to different dies. The RDL 11 may be formed by a layer-by-layer process and may be formed by using a thin film technique. In this embodiment, the first face 111 of the RDL 11 is formed by the medium layer 114 to achieve passivation of the RDL 11.

Referring to FIG. 1, the sensing element 12, the first die 16, and the second die 17 are electrically connected to the RDL 11. The type of the first die 16 can depend on a specific application. For example, the first die 16 can be a logical component (such as an ASIC), a memory, or other components. The second die 17 can be a passive component such as a capacitor or an inductor. In this embodiment, the first die 16 and the second die 17 are electrically connected to the first face 111 of the RDL 11 for being connected to the re-configuration line 113, so as to be electrically connected to the RDL 11.

In addition, the sensing element 12 is electrically connected to the first face 111 of the RDL 11. The electrical connection can be achieved by using a plurality of appropriate techniques. For example, in this embodiment, the electrical connection between the sensing element 12 and the RDL 11 is achieved by means of a through silicon via (TSV) electrical connector. Specifically, the cover body 14 is located between the redistribution layer 11 and the sensing element 12, the cover body 14 is partially in contact with the sensing element 12, a TSV electrical connector 121 is arranged in the part of the cover body 14 that is in contact with the sensing element 12, and the TSV electrical connector 121 penetrates the cover body 14. The sensing element 12 is connected to the re-configuration line 113 on the first face 111 of the RDL 11 by means of the TSV electrical connector 121, to achieve the electrical connection to the RDL 11.

Then, the sensing element 12, the first die 16, and the second die 17 can be encapsulated by using the moulding compound 13. The moulding compound 13 consists of, for example, a thermosetting crosslinked resin (such as epoxy resin), liquid or granule, and a sheet or a film. The sensing element 12, the first die 16 and the second die 17 can be encapsulated by using appropriate techniques, for example, compression moulding, liquid encapsulant injection, and lamination. In this embodiment, the moulding compound 13 is a layer with continuous and uniform composition that is filled on the side of the first face 111 of the RDL 11 and that encapsulates the sensing element 12, the first die 16, and the second die 17. As shown in FIG. 1, the moulding compound 13 comprises the third face 131 and the fourth face 132 opposite to each other. When the moulding compound 13 encapsulates the first die 16 and the second die 17 on the first face 111 of the RDL 11, the third face 131 of the moulding compound 13 is in contact with the first face 111 of the RDL 11, and lateral sides of the sensing element 12, the first die 16, and the second die 17 are encapsulated in the moulding compound 13. In addition, the moulding compound 13 is also formed on front surfaces 122, 161, and 171 of the sensing element 12, the first die 16, and the second die 17 which are far away from the first face 111 of the RDL 11, that is, the sensing element 12, the first die 16, and the second die 17 are completely encapsulated in the moulding compound 13. Those skilled in the art should understand that not all of the front surfaces of the sensing element 12, the first die 16, and the second die 17 are required to be encapsulated in the moulding compound 13. In some embodiments, only the lateral sides of the sensing element 12, the first die 16, and the second die 17 are encapsulated in the moulding compound 13. Moreover, the moulding compound 13 is not formed on the front surfaces 122, 161, and 171 of the sensing element 12, the first die 16, and the second die 17. In some embodiments, the front surfaces 122, 161, and 171 of the sensing element 12, the first die 16, and the second die 17 can be flush with the fourth face 132 of the moulding compound 13.

The moulding compound 13 comprises at least one conductive column 15. In this embodiment, the conductive column 15 is a through mould via (TMV) electrical connector, and the TMV electrical connector penetrates the third face 131 and the fourth face 132 of the moulding compound 13 and is connected to the first face 111 of the RDL 11. Specifically, the TMV electrical connector is connected to a single re-configuration line or a plurality of re-configuration lines of the RDL 11 to achieve electrical connection to the RDL 11. The TMV electrical connector can be formed on the moulding compound 13 in any appropriate manner, including formation by drilling such as laser drilling. Alternatively, a columnar structure may be prearranged in a process of forming the moulding compound so as to form the TMV electrical connector in a demoulding process. The TMV electrical connector can be cleaned for subsequent processing after being formed. The cleaning may include any appropriate operation, for example, wet etching, plasma etching, or a combination thereof. The number of TMV electrical connectors is determined based on the number of input/output (I/O) elements comprised on the RDL 11. By arranging a TMV electrical connector, outputting a signal of the package assembly 100 of the sensor to other circuits such as a PCB board serving as a carrier substrate of the package assembly 100 of the sensor can be achieved. As shown in FIG. 1, a conductive filler is added to the TMV electrical connector, and the filler is a plugging material or a metal such as copper. Filling can be implemented by any appropriate operation to ensure a proper electrical connection between the filler and the RDL 11. A pad 18 is further arranged on a part of the TMV electrical connector on the fourth face 132 of the moulding compound 13. The TMV electrical connector is connected to the pad 20.

The package assembly 100 of the sensor further comprises a conductive bump 20. After the moulding compound 13 is formed, the conductive bump 20 may be attached to the moulding compound 13 or is directly formed on the moulding compound 13. As shown in the figure, the conductive bump 20 is arranged on a part of the TMV electrical connector on the fourth face 132 of the moulding compound 13. The conductive bump 20 can be of a plurality of structures, such as a solder ball, or a plated pile shown in the figure. The conductive bump 20 is configured to electrically connect the package assembly 100 of the sensor to other circuits such as a PCB serving as a carrier substrate.

In this embodiment, the sensing element 12 is an MEMS fluid pressure sensing element for sensing pressure of an external medium such as air or liquid. The first die 16 is an ASIC, the ASIC comprises one or more circuits embedded in and/or on a substrate such as silicon, gallium arsenide, silicon carbide (SiC), graphene, or any semiconductor material, and the ASIC is configured to perform a specific task or implement a specific function. Specifically, the external medium enters the first space 21 through the second via 141 and the first via 113, and the sensing element 12 senses the pressure of the external medium in the first space 21. The first die 16 and the second die 17 electrically connected to the sensing element 12 by means of the RDL 11 convert the pressure of the external medium that is sensed by the sensing element 12 into an electrical signal, and output the electrical signal via the conductive column 15.

The package assembly 100 further has the pad 18 on a part of the TMV electrical connector where same penetrates the fourth face 132 of the moulding compound 13, and the pad 18 extends to an outer surface of the side wall 133 of the moulding compound 13 along the fourth face 132 of the moulding compound 13, and forms, in a transition region between the outer surfaces of the fourth surface 132 and the sidewall 133, a solder paste floating channel 23 that can be clearly seen in automated optical inspection (AOI).

Figure 2:
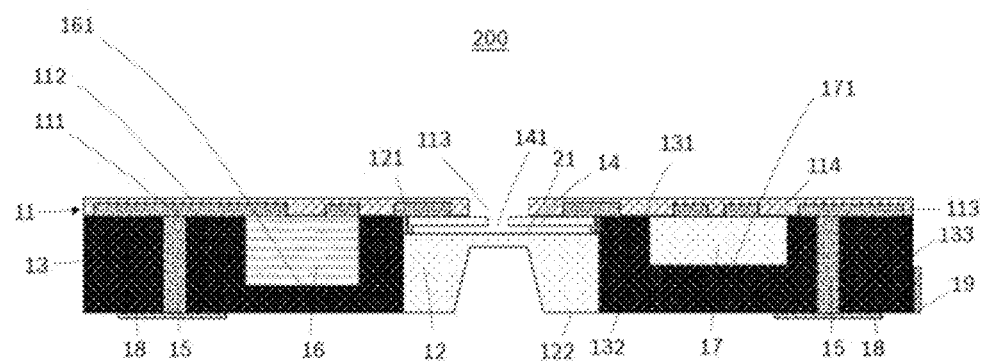
FIG. 2 shows a schematic cross-sectional structural diagram of a package assembly of a sensor according to another embodiment of the present disclosure.

FIG. 2 shows a cross-sectional structure of a package assembly 200 of a sensor according to another embodiment of the present disclosure. Compared with FIG. 1, in the package assembly 200, lateral sides of a sensing element 12, a first die 16, and a second die 17 are encapsulated in a moulding compound 13, and the moulding compound 13 is also formed on front surfaces 161 and 171 of the first die 16 and the second die 17 that are far away from a first face 111 of an RDL 11, that is, the first die 16 and the second die 17 are completely encapsulated in the moulding compound 13. In addition, a front surface 122 of the sensing element 12 that is far away from the first face 111 of the RDL 11 is flush with a third face 132 of the moulding compound 13, and the sensing element 12 is at least partially exposed outside the moulding compound 13. Such an arrangement helps the sensing element 12 sense a property of an external medium outside the sensor, for example, pressure of the external medium such as air or liquid. The sensor enables communication between the external medium and the sensing element 12 in an appropriate manner, for example, a PCB (not shown in the figure) serving as a carrier substrate of the package assembly 200 of the sensor can be provided with a via, and the via enables the communication between the sensing element 12 and the external medium. Further, as shown in FIG. 2, the external medium that communicates with the sensing element 12 by means of the via provided on the PCB may be different from an external medium in the first space 21. Therefore, the sensor comprising the package assembly 200 can simultaneously sense pressure of different external media in an external space, and the sensing element 12 and the first die 16 and the second die 17 that are electrically connected to the sensing element 12 by means of the RDL 11 cooperate with each other to compare pressure of different external media that is sensed by the sensing element 12, for example, by calculating a difference between pressure of different external media.

By arranging an RDL and a moulding compound, an expansion area of a package assembly of a sensor allows more assemblies to be packaged together, thereby providing a better structural support or providing a better heat dissipation for the package assembly. In addition, coupling of the RDL and the moulding compound further achieves a package form of a system in package (SIP). The SIP structure uses the RDL to fan out an electrical terminal of a die and allows packaging of a cover, thereby reducing the volume and costs of the entire package assembly.

Next-level packaging can be further performed on the package assembly of the sensor in the present disclosure and other circuits such as a carrier substrate, to form, for example, an MEMS pressure/pressure difference sensor.

For those skilled in the art, a variety of corresponding modifications and variations can be made according to the above technical solutions and concepts, and all the modifications and variations shall fall within the protection scope of the claims of the present disclosure.

The invention claimed is:

1. A package assembly of a sensor, comprising:
a redistribution layer having a first face and a second face that are opposite to each other, and a first via that penetrates the first face and the second face;
a first die electrically connected to the first face of the redistribution layer;
a sensing element electrically connected to the first face of the redistribution layer;
a cover body located between the redistribution layer and the sensing element, wherein the cover body has a second via that penetrates the cover body, and the second via communicates with the first via; and
a moulding compound comprising a third face and a fourth face that are opposite to each other, wherein the moulding compound encapsulates the first die and the sensing element on the side of the first face of the redistribution layer, and the fourth face of the moulding compound is combined with the first face of the redistribution layer.

2. The package assembly according to claim 1, wherein the package assembly of the sensor further has a second die, and the second die is electrically connected to the first face of the redistribution layer; and
the moulding compound encapsulates the second die on the side of the first face of the redistribution layer.

3. The package assembly according to claim 1, wherein the package assembly further comprises a through mould via electrical connector, and the through mould via electrical connector penetrates the third face and the fourth face of the moulding compound and is connected to the redistribution layer; and
the third face of the moulding compound further comprises a pad, and the redistribution layer is electrically connected to the pad by means of the through mould via electrical connector.

4. The package assembly according to claim 3, wherein the moulding compound further comprises a side wall connected to the third face and the fourth face, and the pad extends to an outer surface of the side wall of the moulding compound along the fourth face of the moulding compound.

5. The package assembly according to claim 1, wherein:
the cover body is partially in direct contact with the sensing element;
a first space is formed between the cover body and the sensing element; and
the first space communicates with external space through the second via and the first via.

6. The package assembly according to claim 5, wherein the cover body is a silicon cover, the cover body comprises a through silicon via electrical connector that penetrates the cover body, and the sensing element is electrically connected to the first face of the redistribution layer by means of the through silicon via electrical connector.

7. The package assembly according to claim 1, wherein the package assembly further comprises a conductive bump that is arranged on a part of a conductive column on the fourth face of the moulding compound.

8. The package assembly according to claim 1, wherein the sensing element has a front surface that is far away from the first face of the redistribution layer, and the front surface is flush with the fourth face of the moulding compound; and
the sensing element is at least partially exposed outside the moulding compound.

9. The package assembly according to claim 1, wherein the sensing element is an MEMS pressure sensing element; and
the first die is an ASIC.

10. A micro electro-mechanical system sensor, comprising a package assembly of a sensor according to claim 1, and a carrier substrate, wherein the package assembly of the sensor is mounted on the carrier substrate.

11. The packaging assembly according to claim 5, wherein:
no portion of the moulding compound is exposed to the first space.

12. The packaging assembly according to claim 5, wherein:
the second face of the redistribution layer is above the first face of the redistribution layer; and
a portion of the cover body does not have any portion of the redistribution layer located directly above the portion of the cover body.

13. The packaging assembly of claim 1, wherein:
an outermost portion of the cover body abuts a portion of the moulding compound.

* * * * *